US012579335B2

(12) United States Patent
Wang et al.

(10) Patent No.: US 12,579,335 B2
(45) Date of Patent: Mar. 17, 2026

(54) OVERALL HYDRAULIC PERFORMANCE PREDICTION METHOD FOR SINK-TYPE DISHWASHER

(71) Applicants:Jiangsu University, Zhenjiang City (CN); Wenling Fluid Machinery Technology Institute, Jiangsu University, Wenling City (CN)

(72) Inventors: Xikun Wang, Zhenjiang City (CN); Yalin Li, Zhenjiang City (CN); Haichao Sun, Zhenjiang City (CN); Yuhan Gao, Zhenjiang City (CN); Mingxuan Li, Zhenjiang City (CN); Yujian Fang, Taizhou City (CN)

(73) Assignees: Jiangsu University, Zhenjiang City (CN); Wenling Fluid Machinery Technology Institute, Jiangsu University, Wenling City (CN)

( * ) Notice: Subject to any disclaimer, the term of this patent is extended or adjusted under 35 U.S.C. 154(b) by 158 days.

(21) Appl. No.: 18/418,341

(22) Filed: Jan. 22, 2024

(65) Prior Publication Data

US 2024/0281568 A1      Aug. 22, 2024

(30) Foreign Application Priority Data

Feb. 16, 2023    (CN) ......................... 202310124841.2

(51) Int. Cl.
| | |
|---|---|
| *G06F 30/17* | (2020.01) |
| *A47L 15/00* | (2006.01) |
| *G01M 99/00* | (2011.01) |

(52) U.S. Cl.
CPC .......... *G06F 30/17* (2020.01); *A47L 15/0086* (2013.01); *G01M 99/005* (2013.01)

(58) Field of Classification Search
CPC .......... G06F 30/00; G06F 30/17; G06F 30/20; G06F 2111/10; G06F 2119/14; A47L 15/0086; G01M 99/005; Y02B 40/00
(Continued)

(56) References Cited

FOREIGN PATENT DOCUMENTS

| | | |
|---|---|---|
| CN | 111209637 A | 5/2020 |
| KR | 102045239 B1 | 12/2019 |

OTHER PUBLICATIONS

Ning, Chao et al., "Numerical Analysis of a New Type of Dishwasher Pump for Different Rotation Speeds of the Volute", Jan. 11, 2022, Frontiers in Energy Research, vol. 9, Article 825159. (Year: 2022).*

(Continued)

*Primary Examiner* — Cedric Johnson
(74) *Attorney, Agent, or Firm* — Addison D. Ault; IPGentleman Intellectual Property Services, LLC

(57) ABSTRACT

Method for predicting the overall hydraulic performance of a sink-type dishwasher. Process begins with unsteady numerical computation on a dishwasher pump under static conditions to obtain a characteristic pump curve. Using this curve, rotation velocity adaptation coefficient ($A_d$) and axial velocity coefficient ($B_d$) are determined. Mapping relationship is established between composite superposition virtual impeller and composite impeller. Passive rotation velocity of the volute and the nozzle flow rate are calculated using GMO model and virtual impeller. A jet mass source is established, using the nozzle flow rate and the volute's passive rotation velocity as boundary conditions. This leads to a non-submerged rotating jet flow computation with a multi-nozzle setup using the VOF method. This approach streamlines the dishwasher's intricate multi-physics, conserves computing resources, and effectively resolves issues related to free surface divergence and estimating the volute's (Continued)

passive rotation speed, leading to an accurate prediction of the dishwasher's overall hydraulic performance.

9 Claims, 16 Drawing Sheets

(58) Field of Classification Search
USPC ......................................................... 703/7, 6
See application file for complete search history.

(56) References Cited

OTHER PUBLICATIONS

Sun, Haichao et al., "Parametric Analysis and Optimization Design of the Twin-Volute for a New Type of Dishwasher Pump", Jan. 17, 2023, MPDI, vol. 11, No. 305. (Year: 2023).*

Zhu et al., "Experimental Investigation of Unsteady Pressure Pulsation in New Type Dishwasher Pump with Special Double-Tongue Volute", Nov. 14, 2021, MDPI, vol. 9, No. 288. (Year: 2021).*

* cited by examiner

OVERALL HYDRAULIC PERFORMANCE PREDICTION METHOD FOR SINK-TYPE DISHWASHER

TECHNICAL FIELD

The present invention relates to a simulation prediction method for an internal hydraulic washing mechanism of a dishwasher, and in particular to an overall hydraulic performance prediction method for a sink-type dishwasher based on a multi-physics coupling simulation strategy, so as to solve the problems: the difficulty in accurately describing the turbulence model that occurs when directly simulating the internal turbulence mechanism of a dishwasher; the difficulty in achieving convergence of the residual curve; the difficulty in effectively controlling a computation process due to a variable negative angle of the dynamic mesh caused by the passive rotation velocity of the volute and lack of conservation of mass caused by a free surface; and the excessive demand for computing resources.

BACKGROUND ART

As a household kitchen appliance, dishwashers have successfully liberated people's hands from repeated dish washing work.

In recent years, Fotile has developed a sink-type dishwasher. The dishwasher is provided with a new type of dishwasher water pump, namely, a twin-volute type spraying arm. A volute in a working state will be passively rotated, thereby inducing a rotating jet flow. The passive rotation involves the problems of gas-liquid two-phase flow, free surface flow, six-degree-of-freedom motion, and fluid-structure interaction. The rotating jet flow is subject to the category of non-submerged jet flow, and also involves the problems of free surface flow and gas-liquid two-phase flow. It can be seen that the passive rotation of the volute is an extremely complex multi-physics problem. If the existing simulation technology is used for an overall simulation, there are still some significant difficulties in accurately simulating its internal flow characteristics. This is mainly manifested in the challenges of selecting an appropriate turbulence model, the substantial consumption of simulation computing resources, and problems such as the passive rotation velocity of the volute causing the dynamic mesh to easily vary in negative angle and the free surface causing a lack of mass conservation, making it difficult to achieve convergence and control in the computation process. Therefore, the creation of an overall simulation prediction method has become an important issue to be addressed for sink-type dishwashers.

Through the search, there is no relevant report on an overall simulation prediction method for sink-type dishwasher based on multi-physics coupling strategy.

SUMMARY

In view of the problems existing in the existing simulation technology, an object of the present invention is to overcome the problem of multi-physics complex simulation caused by passive rotation of a volute in a dishwasher, and to provide a step-by-step overall simulation prediction method for a dishwasher. Via the present invention, the problems of direct simulation, such as the difficulty in accurately describing the flow field by complex turbulence model, and the extreme difficulty in convergence of computation, can be solved, thus saving computing resources. Simulation results are closer to the real situation.

In order to solve the above technical problems, the specific technical solution adopted by the present invention is as follows:

An overall hydraulic performance prediction method for the new sink-type dishwasher includes the following steps:

step 1: conducting numerical simulations on a composite impeller and a twin-volute spraying arm within the dishwasher, and acquiring the pump characteristic curve of the new type of dishwasher pump when the spraying arm is static;

step 2: obtaining the full-open flow rate $Q_0$ from the pump characteristic curve, obtaining the rotation velocity adaptation coefficient $A_d$ and the axial velocity coefficient $B_d$, performing unsteady simulation on the passive rotation of the volute using the GMO-TruVOF method, then the passive rotation velocity of the volute and the flow rate at the exit of each nozzle can be obtained; and step 3: taking the passive rotation velocity of the volute and the flow rate at the exit of each nozzle as initial conditions, conducting non-submerged rotational unsteady computation on the nozzles based on the FAVOR-TruVOF method, obtaining flow parameters such as hydraulic washing pressure of the dishwasher, and estimating the hydraulic washing capacity of the dishwasher.

Step 1 specifically includes the following processes:

process 1.1: constructing the water body of the new type of dishwasher pump based on models of the composite impeller and the volute type spraying arm, meshing by using ICEM software, and performing unsteady simulation of the new type of dishwasher pump with Fluent software; and process 1.2: conducting numerical simulation predictions of the pump characteristic curve by using the RANS method, calculating the head at a minimum of five different flow rates under static conditions of the volute, and plotting the pump characteristic curve.

Step 2 specifically includes the following processes:

process 2.1: determining the full-open flow rate $Q_0$ using the pump characteristic curve obtained in process 1.2; acquiring the rotation velocity adaptation coefficient $A_d$, and the axial velocity coefficient $B_d$ suitable for the new type of dishwasher pump; constructing a new composite virtual impeller model within the FLOW-3D software, and establishing a mapping relationship between parameters of the virtual impeller and the composite impeller;

process 2.2: constructing the near-field computational domains at the exits of the nozzles, conducting Cartesian meshing on the virtual impeller, the volute spraying arm, and the near field of the nozzle jet flow domain based on FAVOR technology, and selecting an appropriate mesh resolution to ensure effective analysis of the computational domain; and process 2.3: enabling fluid-structure interaction and free surface computation of the new type of dishwasher pump based on the virtual impeller and the GMO-TruVOF method to realize the numerical simulation of the passive rotation of the volute, and monitoring the passive rotation velocity of the volute and the flow rate at the exit of each nozzle.

Step 3 specifically includes the following processes:

process 3.1: constructing a gas-liquid two-phase non-submerged jet flow computational domain with a free surface in a sink of the dishwasher, and setting a jet mass source in the computational domain;

process 3.2: computing a complex non-submerged rotating jet flow field of a multi-nozzle combination based on the FAVOR-TruVOF method by taking the flow rate at the exit of each nozzle and the passive rotation velocity of the volute obtained in process 2.3 as boundary conditions of the jet mass source; and process 3.3: post-processing non-submerged rotating jet flow computation results, which includes analyzing distribution laws of jet flow impact pressure, vorticity, and other flow parameters, as well as evaluating the overall hydraulic performance of the dishwasher.

In process 1.3, the RANS method is used to simulate pump characteristics of the new type of dishwasher pump. In order to reduce simulation errors, it omits simulating the small flow rate condition and instead, ensures obtaining at least five sets of data relating to head and flow rate. These datasets are then subjected to linear approximation fitting, which includes fitting the pump characteristic curve to obtain the full-open flow rate $Q_0$. Additionally, it also involves solving for rotation velocity adaptation coefficient $A_d$ and axial velocity coefficient $B_d$ using $Q_0$ and a parameter relationship between the original impeller and the virtual impeller. The fitted linear expression is as follows:

$$h = aQ + Q_0$$

where h represents the head of a pump, m;

a represents the slope of the straight line;

Q represents the flow rate, 1/min;

$Q_0$ represents both the horizontal axis intercept of a fitted straight line and the full-open flow rate of the pump.

The original impeller and the virtual impeller have the following geometric relationship:

$$H_{y1} = L \cos \beta_L$$

$$H_{y2} = H + b_2 - 0.3D$$

$$D_{y1} = D$$

$$D_{y2} = D_2$$

$$D_{y3} = d_h$$

where the left side of the equation shows geometric parameters of the two virtual impellers, and the right side of the equation shows several geometric parameters of the original impeller.

$Hy_1$ is the height of the virtual impeller I, m;

$Dy_1$ is the outer diameter of the virtual impeller I, m;

$Hy_1$ is the height of a virtual impeller II, m;

$Dy_2$ is the outer diameter of the virtual impeller II, m;

$Dy_2$ is the hub diameter of the virtual impeller, m;

L is the airfoil chord length of the original impeller, m;

βL is the airfoil angle of the original impeller, °;

H is the height of the back cover plate of the original impeller, m;

$b_2$ is the outlet width of the original impeller, m;

D is the minimum outer diameter of the original impeller, m;

$D_2$ is the maximum outer diameter of the original impeller, m;

$d_h$ is the hub diameter of the original impeller, m.

The rotation velocity adaptation coefficient $A_d$ and the axial velocity coefficient $B_d$ for the new type of dishwasher pump obtained according to the full-open flow rate $Q_0$ and the parameter relationship between the virtual impeller and the composite impeller are as follows:

$$A_d = \frac{\pi g n^2 D_2^2 (C_1 D^2 + C_2 D_2^2)}{4 Q_0 (L \cos \beta_L + H + b_2 - 0.3D)}$$

$$B_d = \frac{12 Q_0}{\pi n (D_2^3 - D^3)}$$

where $C_1 = \varphi \pi^2/3600$ g ($\varphi = 0.92$-$0.98$), and $C_2 = \psi \pi^2/3600$ g ($\psi = 0.67$-$0.75$).

In process 2.1, the construction a composite superposition virtual impeller model includes: innovating the rotation velocity adaptation coefficient $A_d$ and the axial velocity coefficient $B_d$ for the new type of dishwasher pump. Additionally, in combination with the parameter mapping relationship between the composite impeller and the virtual impeller, a virtual impeller assembly is constructed. This assembly comprises two cylinders stacked up and down, replacing a forward curved axial flow cascade and a centrifugal radial blade of the impeller. The outer diameters and heights of the cylinders define the region swept by the blade, and the size of the inner diameter is set. A region fluid flowing out of the cylinders at a certain vortex and axial velocity is also defined, and rotation axes of the cylinders are determined using the two-point method.

In process 2.2, the construction the near field of a non-submerged jet flow domain involves selecting a non-submerged nozzle jet flow height. This height ensures that the water flows out from the nozzles without impacting the monitoring of the nozzle flow rate. It is crucial that the height has no or negligible effect on the setting of the jet mass source in step 3. A recommended near-field height of the jet flow domain is set at 1-2 times the nozzle diameter of the highest point at the top of the nozzle opening.

Process 3.1 involves setting a mass source, encompassing defining an inflow source in the computational domain, which includes setting the position, direction, geometry, and flow velocity of the mass source. The distance between the mass source and the exit of the nozzle is set at 1.5 times the nozzle diameter. Notably, the flow rate is set as a function of time, and is aligned with the flow rate of each nozzle obtained in process 2.3.

The advantageous effects of the present invention are notable. By implementing a step-by-step multi-physics coupling simulation strategy in the overall simulation of a dishwasher, significant conservation of simulation resources is achieved. Additionally, the simulation results more closely align with the real operational conditions of the dishwasher. Furthermore, the challenges that arise from direct simulation of a variable negative angle of a dynamic mesh due to passive rotation velocity of a volute and the lack of mass conservation resulting from a free surface can be effectively circumvented. Moreover, the present invention's numerical simulation of the external characteristics of the new type of dishwasher pump model under different flow conditions in static conditions bypasses the need for non-submerged jet flow simulation with a free surface involving a volute type spraying arm nozzle. The construction of a virtual impeller enables a comprehensive and three-dimensional simulation of the flow characteristics of the impeller based on a
simplified impeller model, leading to a reduction in the
number of Cartesian orthogonal grids. The six-degree-of-
freedom physical field of a non-submerged jet flow of a
volute type spraying arm can be simulated by simply setting
a jet flow mass source. In addition, the new type of dish-
washer pump model is thoroughly studied, employing a
novel step-by-step coupling simulation strategy, and by
setting the jet flow mass source, a complex model can be
simplified and complex superposition physics can be sub-
divided. Moreover, simulation data and results from the
preceding step can be seamlessly transmitted to the next
step. This approach significantly reduces the computational
burden and improves convergence compared to direct simu-
lation, consequently enhancing the accuracy and fidelity of
hydraulic performance prediction for the dishwasher.

DETAILED DESCRIPTION OF THE EMBODIMENTS

Hereinafter, the technical solutions of the present inven-
tion will be described in detail with reference to the accom-
panying drawings and specific embodiments.

Figure 1:
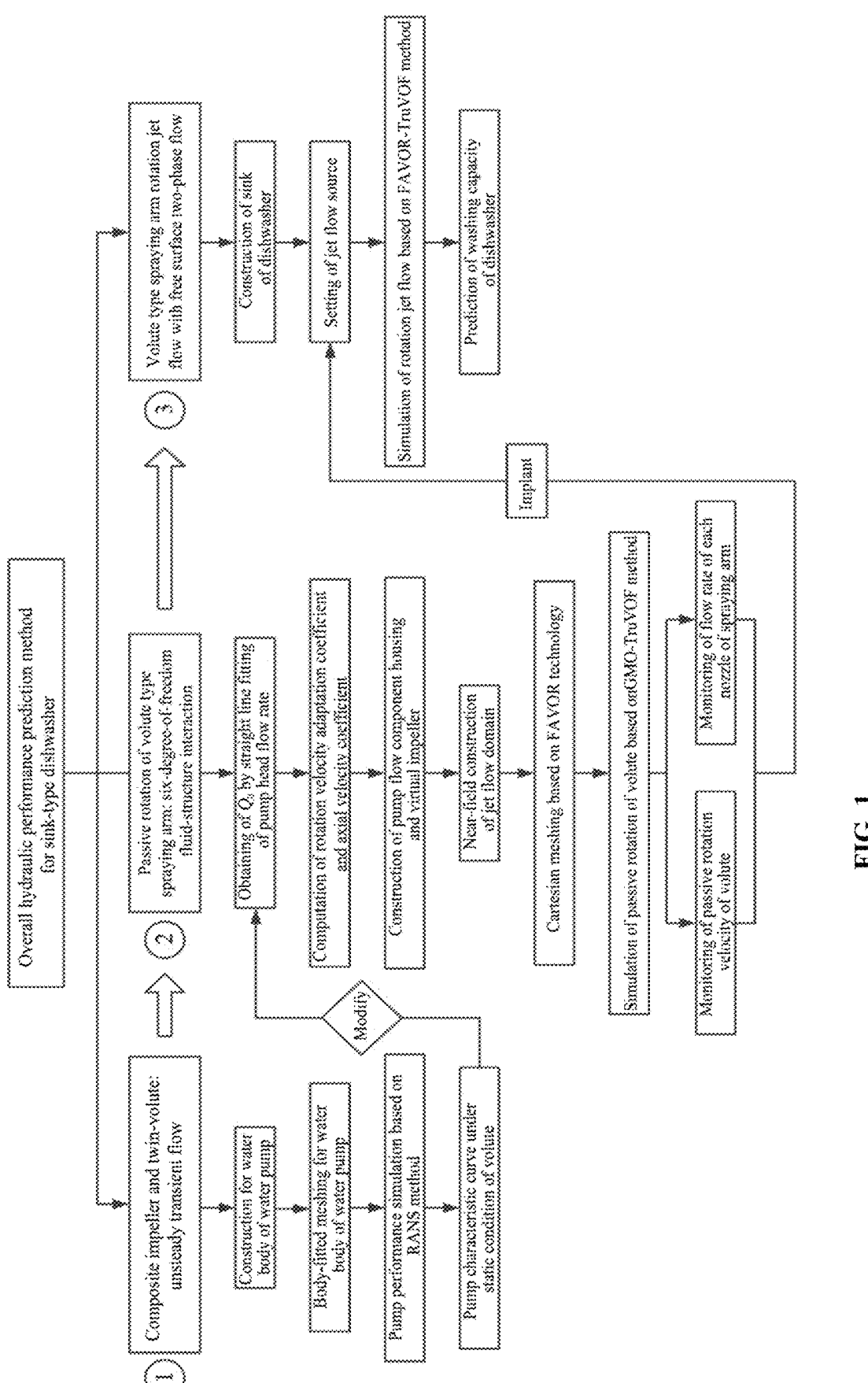
FIG. 1 is the flowchart of simulation prediction of a
dishwasher.

(1) The hydraulic performance prediction of a dishwasher
under a multi-physics coupling simulation strategy is
achieved using a geometric model of a new type of
dishwasher pump of the dishwasher. The whole pre-
diction flow is illustrated in FIG. 1.

Figure 2:
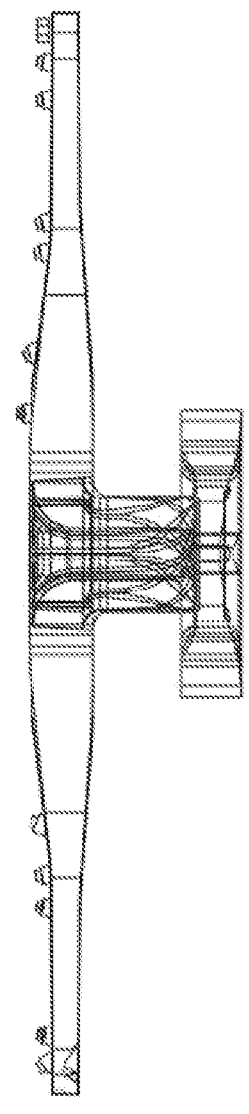
FIG. 2 is the new type of dishwasher pump model of a
dishwasher and a water body computational domain.
Figure 2:
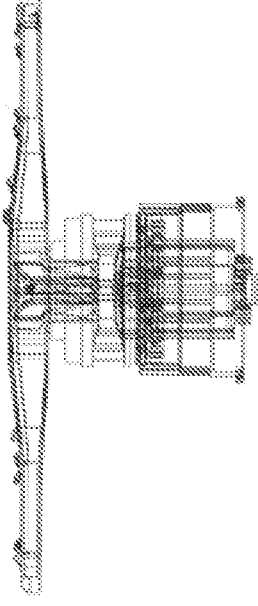

(2) The multi-physics problems of the dishwasher are
primarily concentrated on a volute type spraying arm.
To accurately obtain the heads of the dishwasher pump
under different flow rates without computational diver-
gence, a static state simulation of the volute is con-
ducted. A structural diagram of the pump model and its
computational domain are depicted in FIG. 2.

(3) The meshing process is conducted using ICEM soft-
ware, employing hexahedral structure meshes. The
computational domain is segmented into four compu-
tational regions: an inlet flow channel, a diversion loop
flow channel, an impeller flow channel, and a volute
flow channel. Additionally, a boundary layer is incor-
porated into the wall surface for localized refinement.

(4) Fluent software is employed for performing the exter-
nal characteristic simulation computation. The k-co
turbulence model is adopted for steady computation.
The inlet uses the flow inlet boundary condition with a
specified flow rate setting. The outlet adopts the pres-
sure outlet boundary condition with ambient atmo-
spheric pressure. The wall surface is subject to a
non-slip boundary condition. The impeller domain and
the diversion loop water domain have a rotation veloc-
ity of n, while other components are set as static
domains. The computation is performed using the
SIMPLE algorithm, and a second-order upwind differ-
ence scheme is employed in the discrete process.

Figure 3:
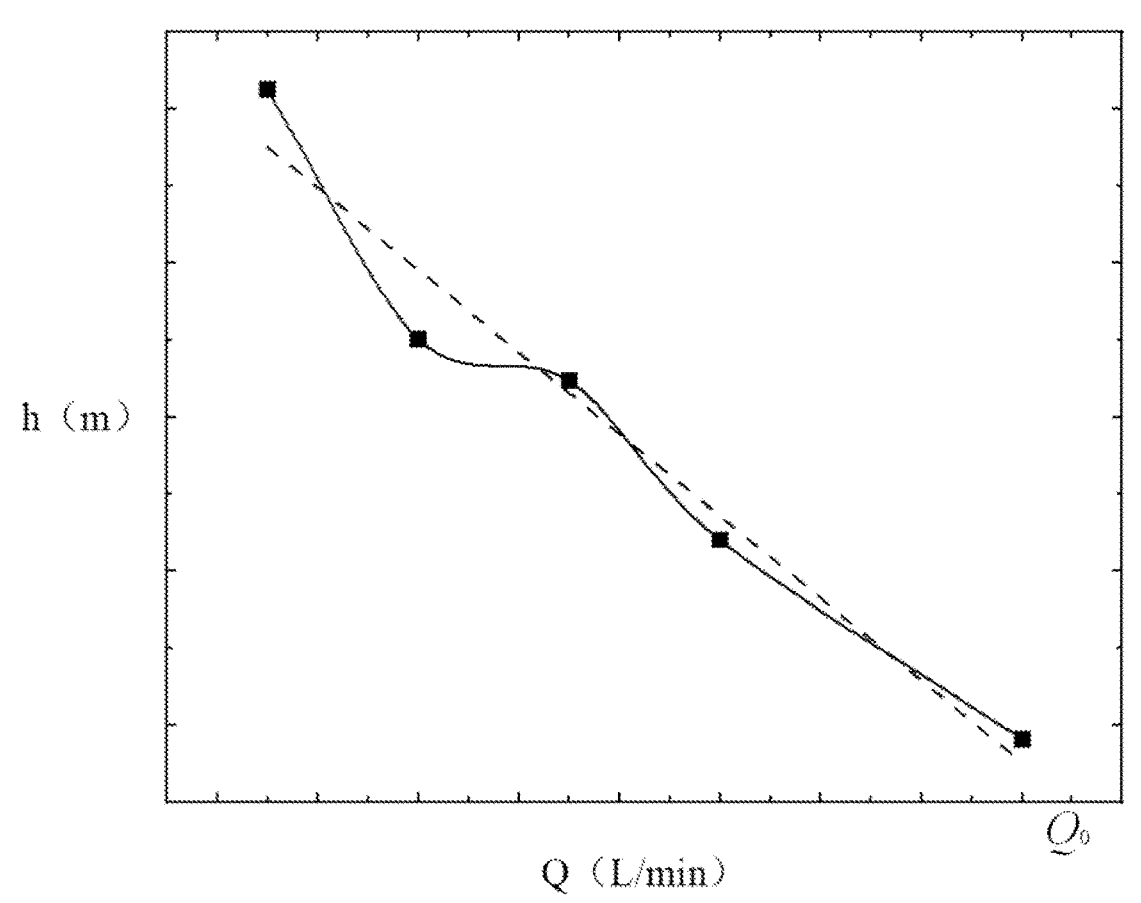
FIG. 3 is the pump characteristic curve prediction (solid
line) of the new type of dishwasher pump and a fitting
approximate value (dashed line).

(5) The performance curve based on RANS numerical
simulation prediction is depicted as the solid line in
FIG. 3. As simulation errors are considerable under
extreme conditions, linear fitting is conducted based on
a minimum 0.5 $Q_d$ condition, resulting in the fitting
result shown as the dotted line in FIG. 4. Through the
linear fitting curve, an approximate equation of the
pump characteristic curve may be derived:

$$h = aQ + Q_0 \qquad \text{(Equation 1)}$$

where a is the slope of the fitted straight line, and $Q_0$
represents the horizontal axis intercept of the fitted
straight line and serves as the full-open flow rate of the
pump.

A maximum head and the full-open flow rate may be
respectively expressed as:

$$\Delta h = \frac{L_0}{g} \cdot \frac{Q_0}{\pi R^{*2}} \cdot A_d \qquad \text{(Equation 2)}$$

$$Q_0 = \frac{2}{3}\pi(R^{*3} - r^3)nB_d \qquad \text{(Equation 3)}$$

where $\Delta h$ represents the maximum head, $L_0$ is the total
height of the impeller, g is gravitational acceleration,
$Q_0$ is the full-open flow rate, $R^*$ is the outer radius of
the impeller, r represents the minimum radius of the
impeller, and n represents the rotation velocity of the
impeller.

Figure 4:
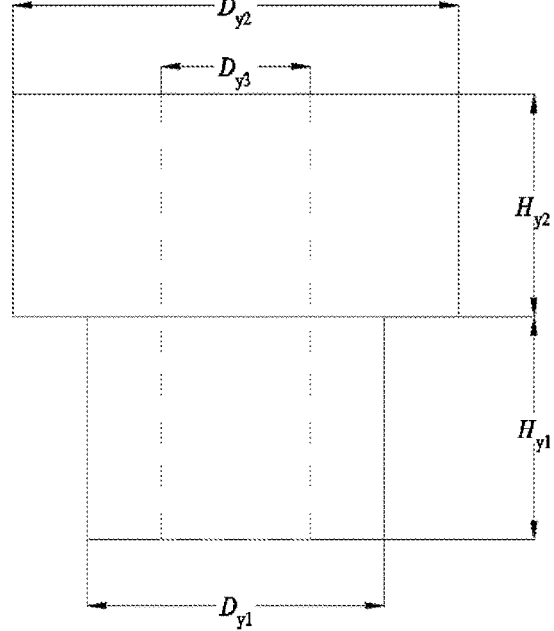
FIG. 4 is the geometric model of the virtual impeller.

(6) The virtual impeller geometry is shown in FIG. 4. Two
hollow cylinders have the same inner diameter. $D_{y3}$ is
the hub diameter, $D_{y2}$ is the impeller diameter, $D_{y1}$ is
the minimum impeller diameter, $H_{y1}$ is the height of
impeller I, $H_{y2}$ is the height of impeller II, and the
heights of the impellers have the following relation-
ship:

$$H_{y1} + H_{y2} = L_0 \qquad \text{(Equation 4)}$$

Figure 5:
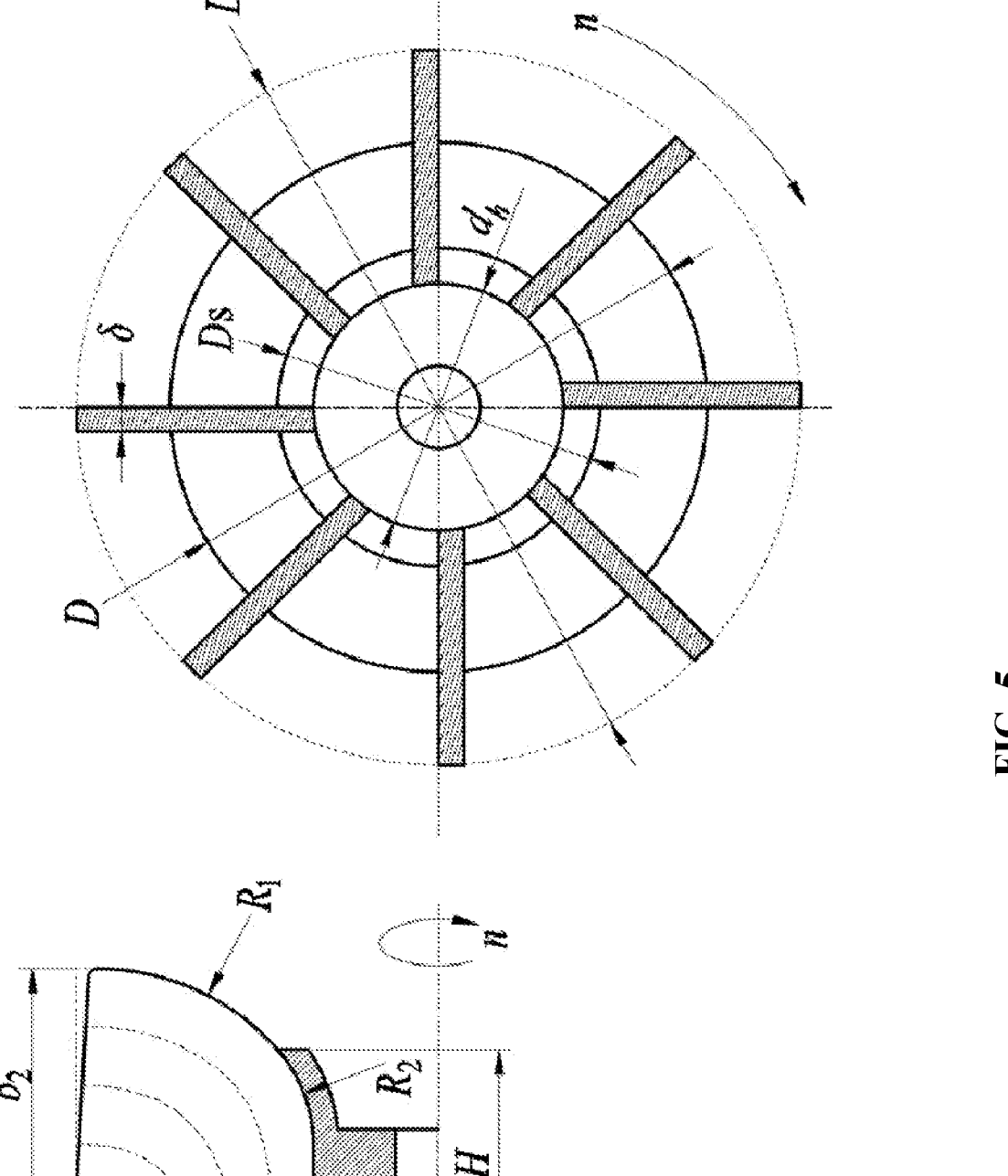
FIG. 5 is the structural diagram of the radial-type blade of
the composite impeller.

(7) The structural diagram of a centrifugal radial impeller
of a composite impeller is depicted in FIG. 5, with the
primary parameters encompassing D as the inlet diam-
eter of the impeller, $D_2$ as the outlet diameter of the
impeller, $b_2$ as the outlet width of the impeller, $d_h$ as the
hub diameter of the impeller, H as the height of a back
cover plate of the impeller, and $\delta$ as the blade thickness.

Figure 6:
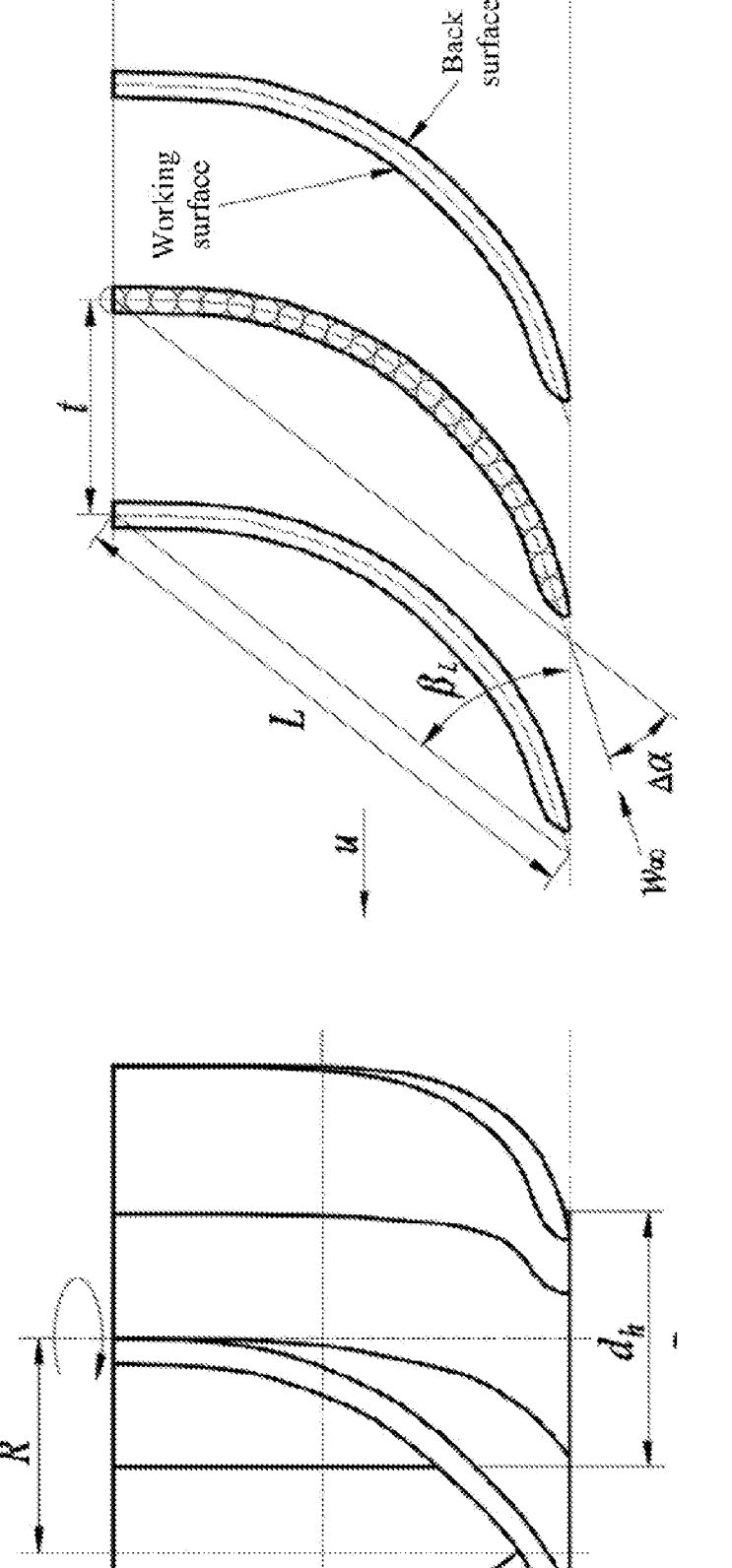
FIG. 6 is the plan view of the forward curved axial flow
cascade of the composite impeller.

(8) FIG. 6 shows the plan view of a forward curved axial
flow cascade of a composite impeller, where the main geometric parameters include L as the airfoil chord length, $d_h$ as the hub diameter of the impeller, $\beta_L$ as the airfoil angle, z as the number of blades, t as a grid distance (calculated as $t=2\pi R/z$), R as the radius of a cylindrical laminar flow surface, and $\Delta\alpha$ as the attack angle, namely, the angle between an incoming flow direction and a chord.

(9) The radial blade illustrated in FIG. 5 and the forward curved axial flow cascade depicted in FIG. 6 together constitute the original composite impeller. The mapping relationship between the partial parameters of the composite impeller and the parameters of the virtual impeller is established:

$$H_{y1} = L\cos\beta_L \qquad \text{(Equation 5)}$$

$$H_{y2} = H + b_2 - 0.3D \qquad \text{(Equation 6)}$$

$$D_{y1} = D \qquad \text{(Equation 7)}$$

$$D_{y2} = D_2 \qquad \text{(Equation 8)}$$

$$D_{y3} = d_h \qquad \text{(Equation 9)}$$

(10) By employing the mapping relationship between the geometric parameters of the composite impeller model and the virtual impeller, and in conjunction with the full-open flow rate $Q_0$ obtained by fitting the head flow curve of the new type of dishwasher pump, a simultaneous relationship of the rotation velocity adaptation coefficient $A_d$ and the axial velocity coefficient $B_d$ with the full-open flow rate $Q_0$ and the parameters of the composite impeller can be derived from (Equation 2) to (Equation 9):

$$A_d = \frac{\pi g n^2 D_2^2 (C_1 D^2 + C_2 D_2^2)}{4 Q_0 (L\cos\beta_L + H + b_2 - 0.3D)} \qquad \text{(Equation 10)}$$

The axial velocity coefficient is:

$$B_d = \frac{12 Q_0}{\pi n (D_2^3 - D^3)} \qquad \text{(Equation 11)}$$

where $C_1 = \varphi\pi^2/3600$ g ($\varphi = 0.92\text{-}0.98$), and $C_2 = \psi\pi^2/3600$ g ($\psi = 0.67\text{-}0.75$).

(11) Based on the parameter mapping relationship between the original impeller and the virtual impeller as stated in (Equation 5) to (Equation 9), specific values of the parameters of the composite impeller of the new type of dishwasher pump, the rotation velocity adaptation coefficient $A_d$, and the axial velocity coefficient $B_d$ are imported into a setting interface of the virtual impeller in FLOW-3D, where a virtual impeller model and the spraying arm are subsequently constructed.

Figure 7:
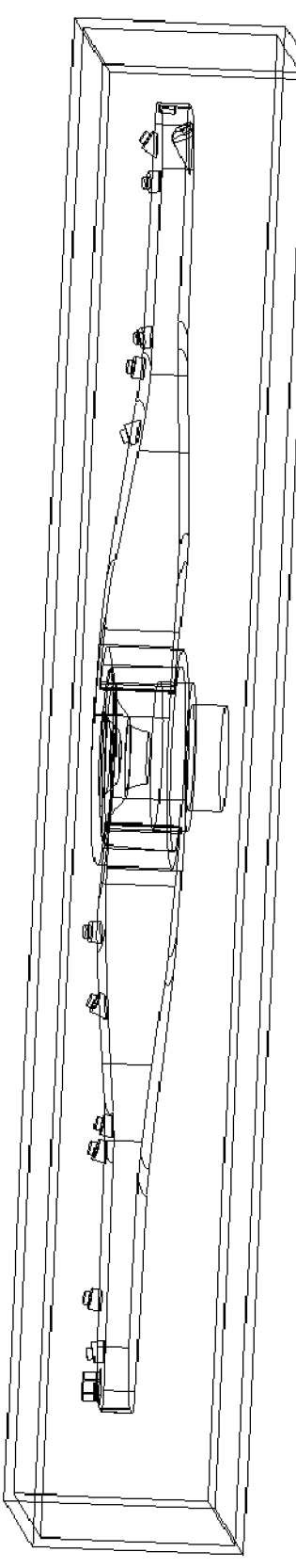
FIG. 7 is the Cartesian coordinate division diagram of the
new type of dishwasher pump.
Figure 8:
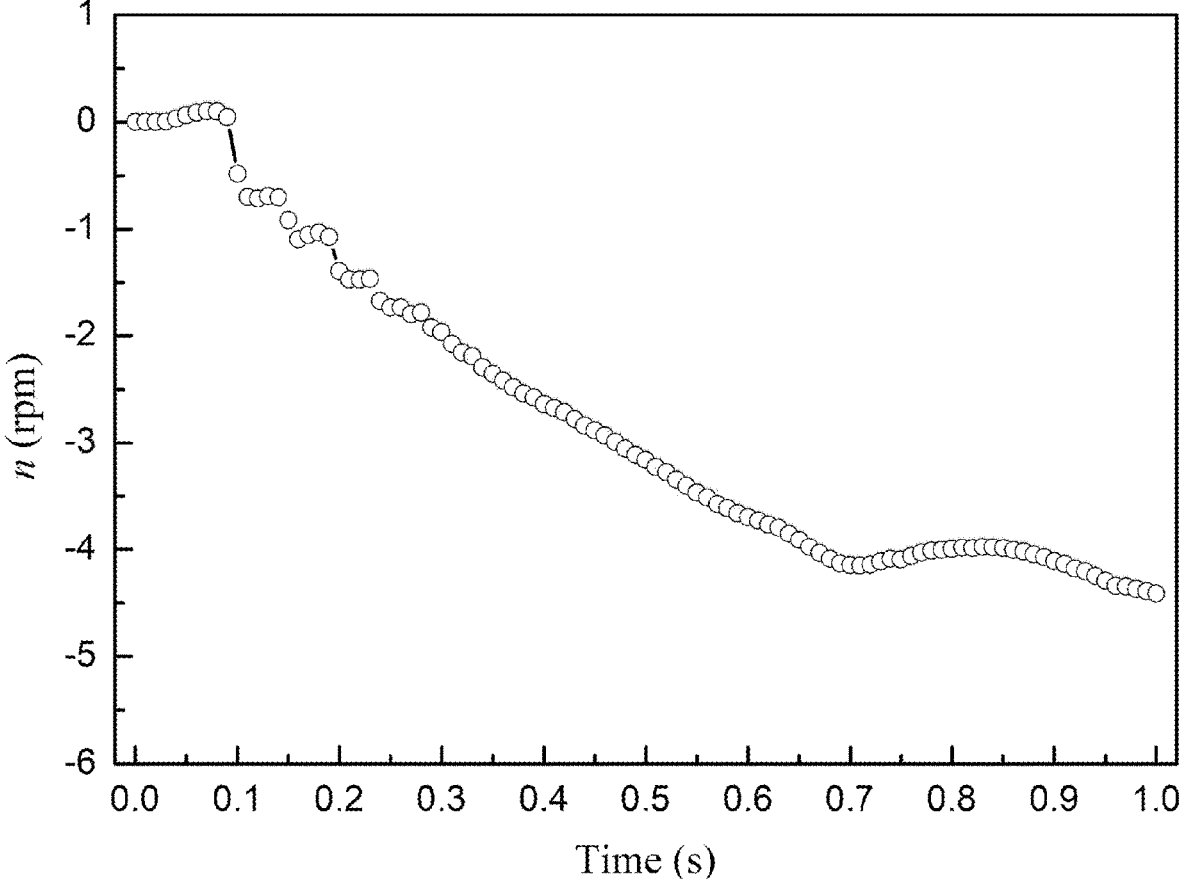
FIG. 8 shows the variation of the volute passive rotation
velocity.
Figure 9A:
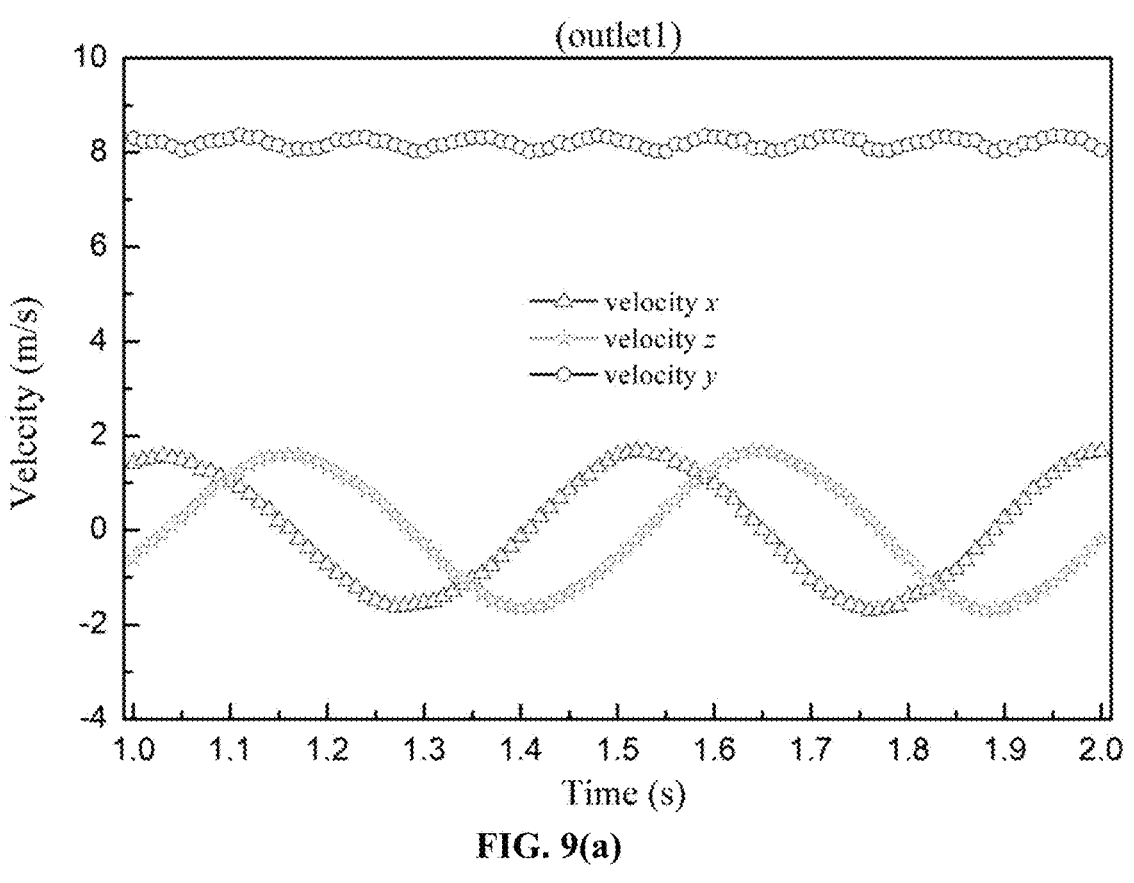
FIGS. 9(a)-9(m) show the fluid velocity of the monitoring
point at the exit of each nozzle.
Figure 9B:
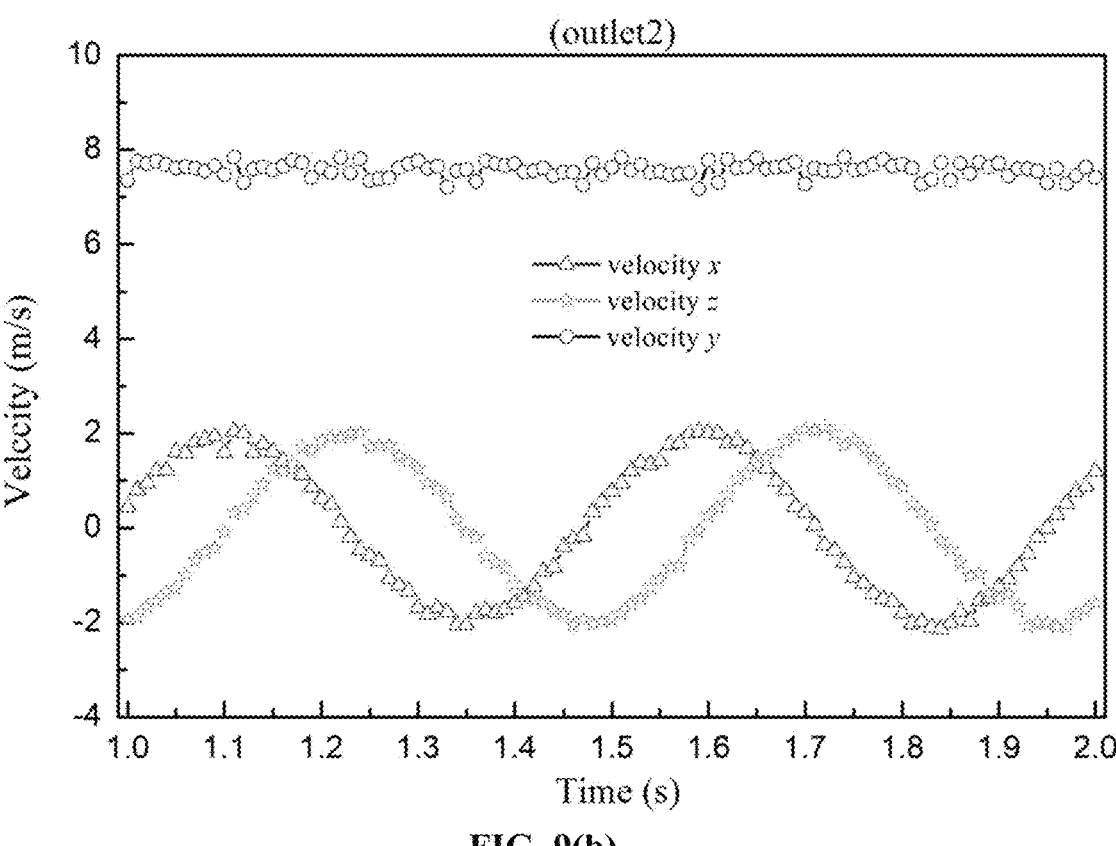
Figure 9C:
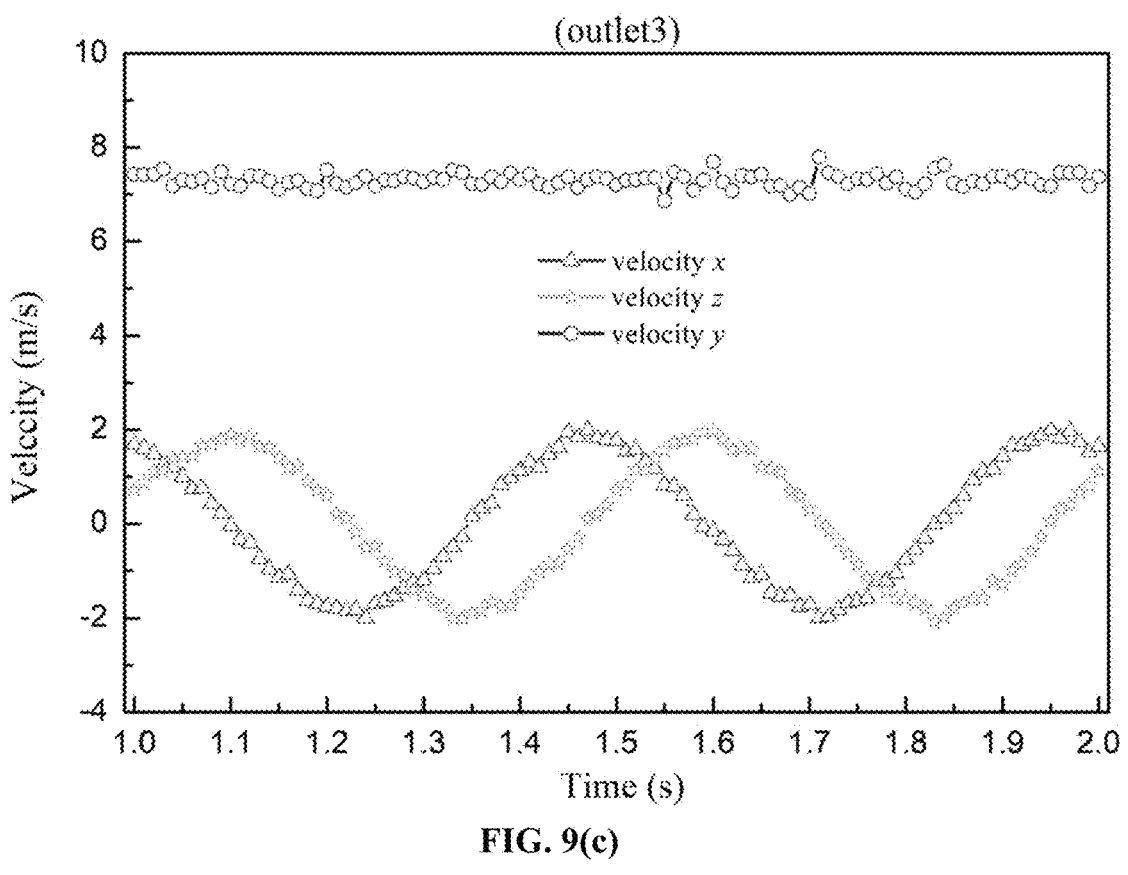
Figure 9D:
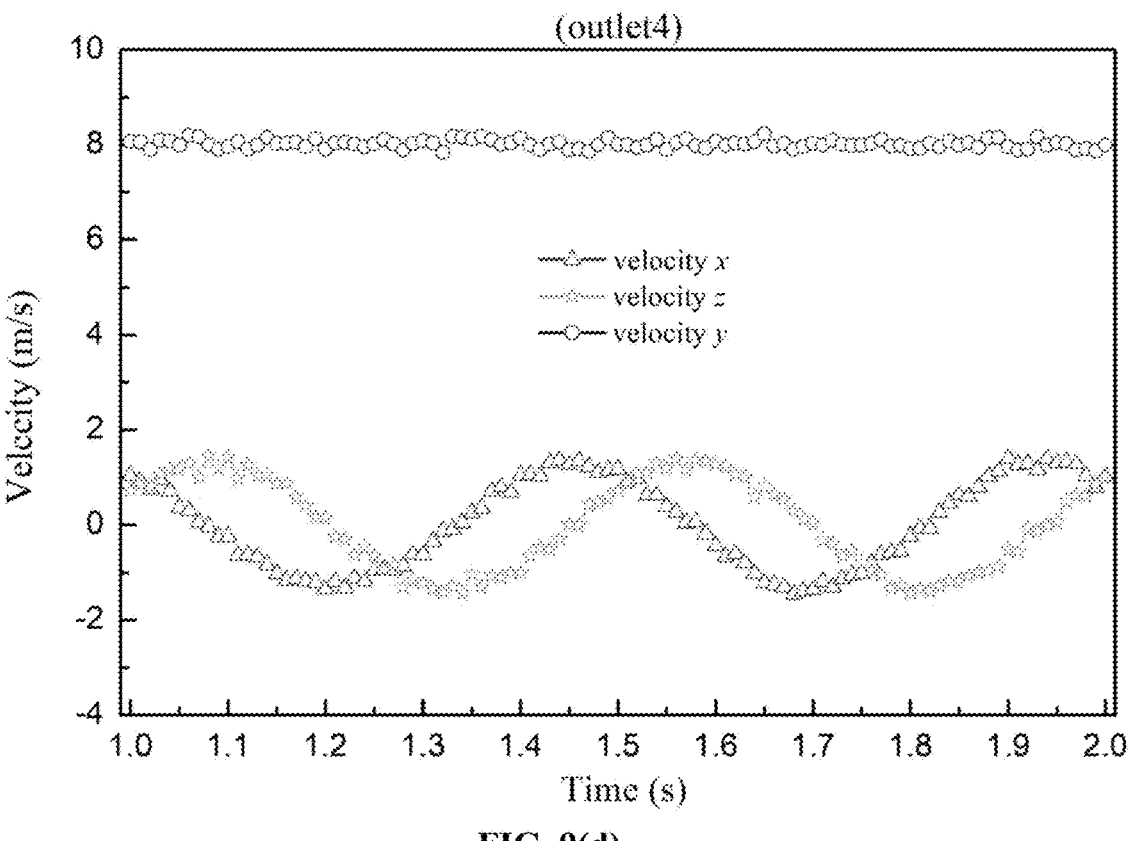
Figure 9E:
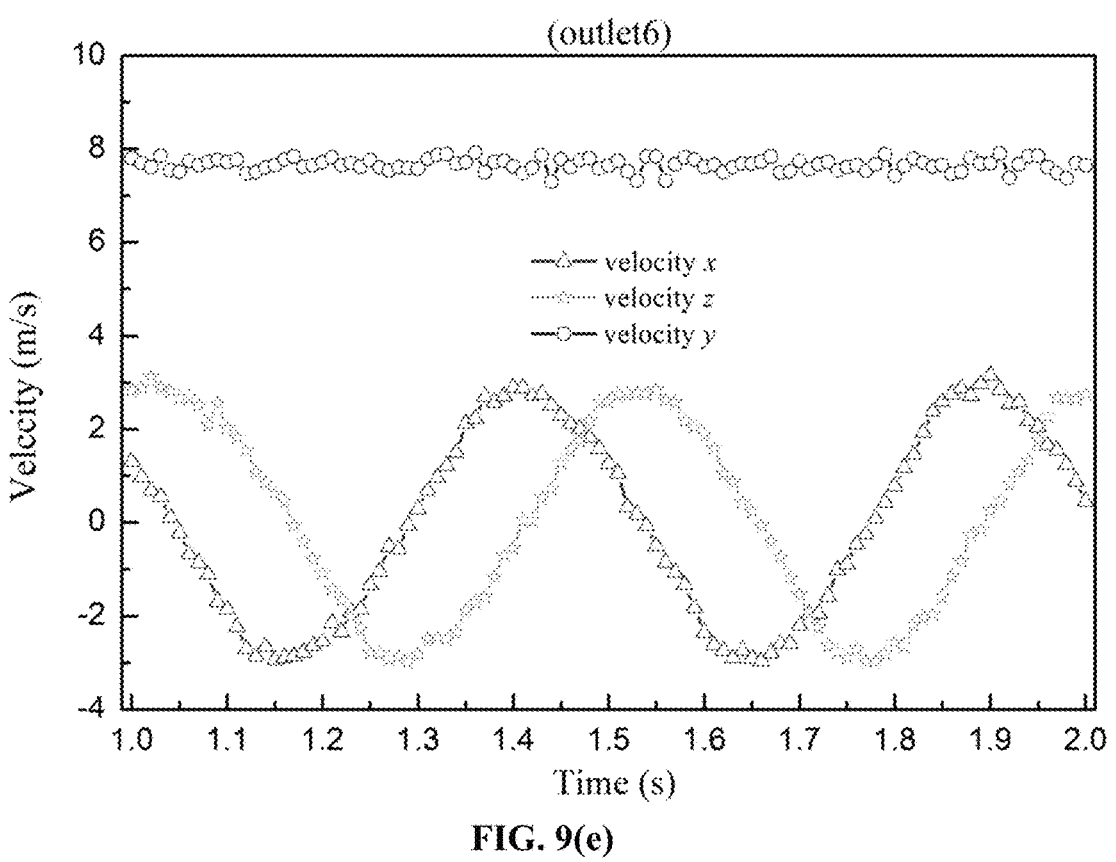
Figure 9F:
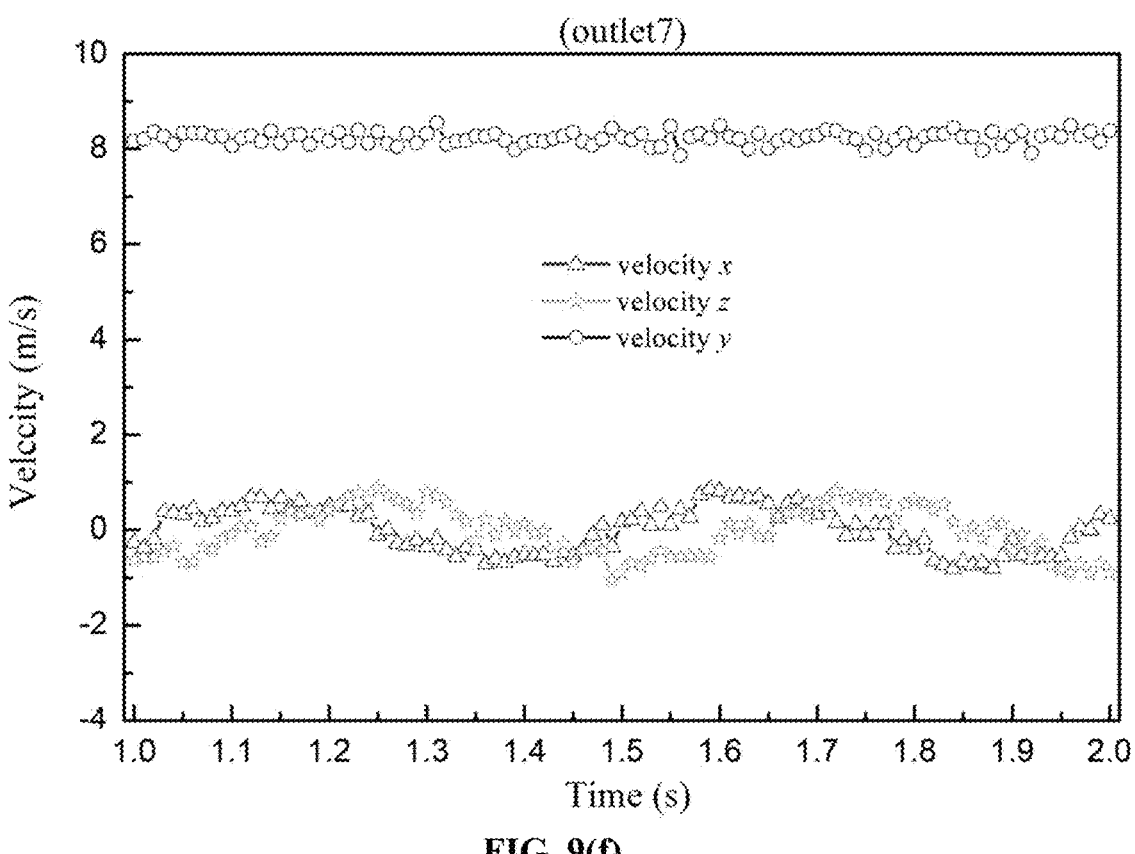
Figure 9G:
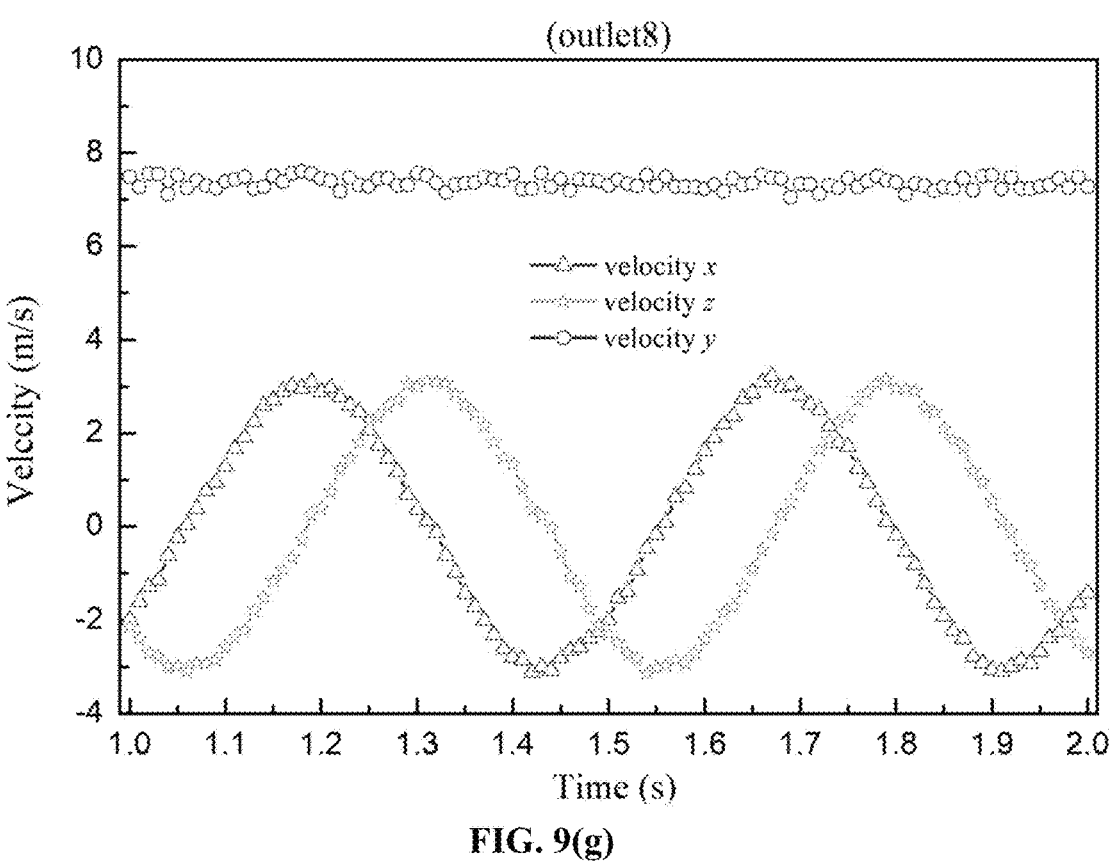
Figure 9H:
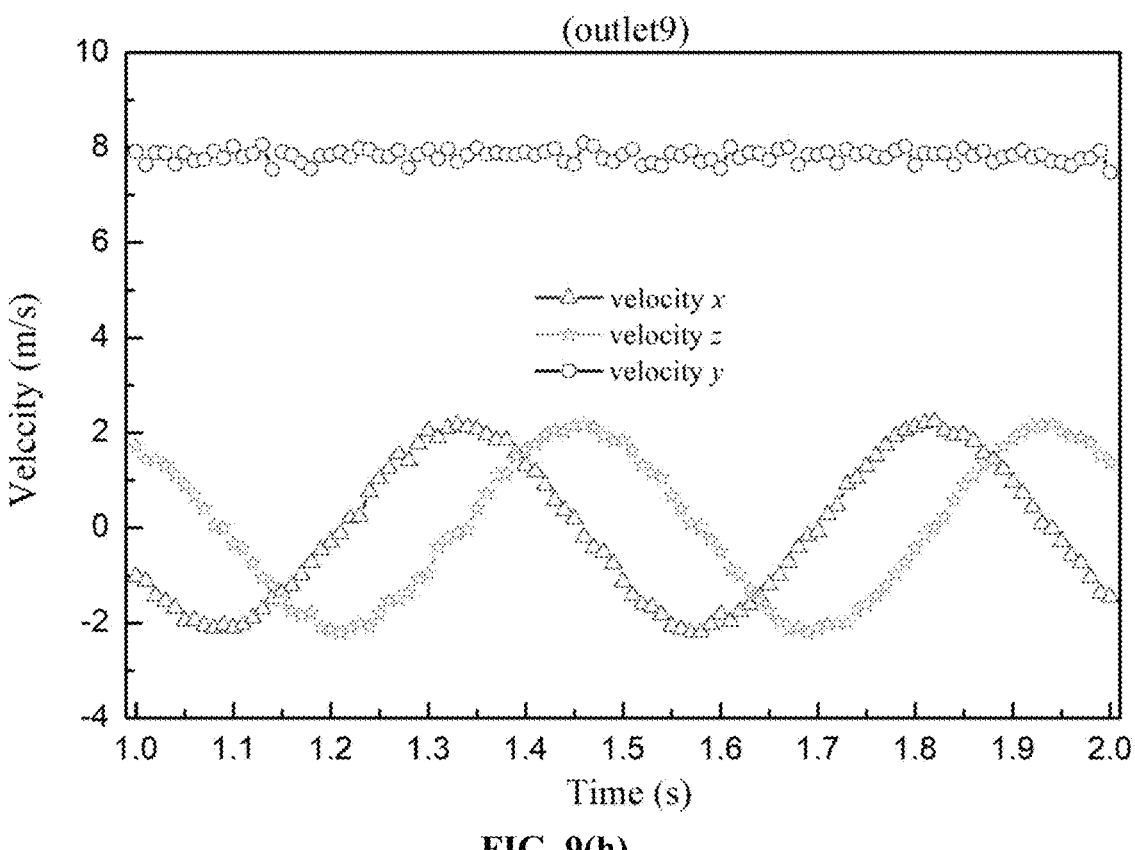
Figure 9I:
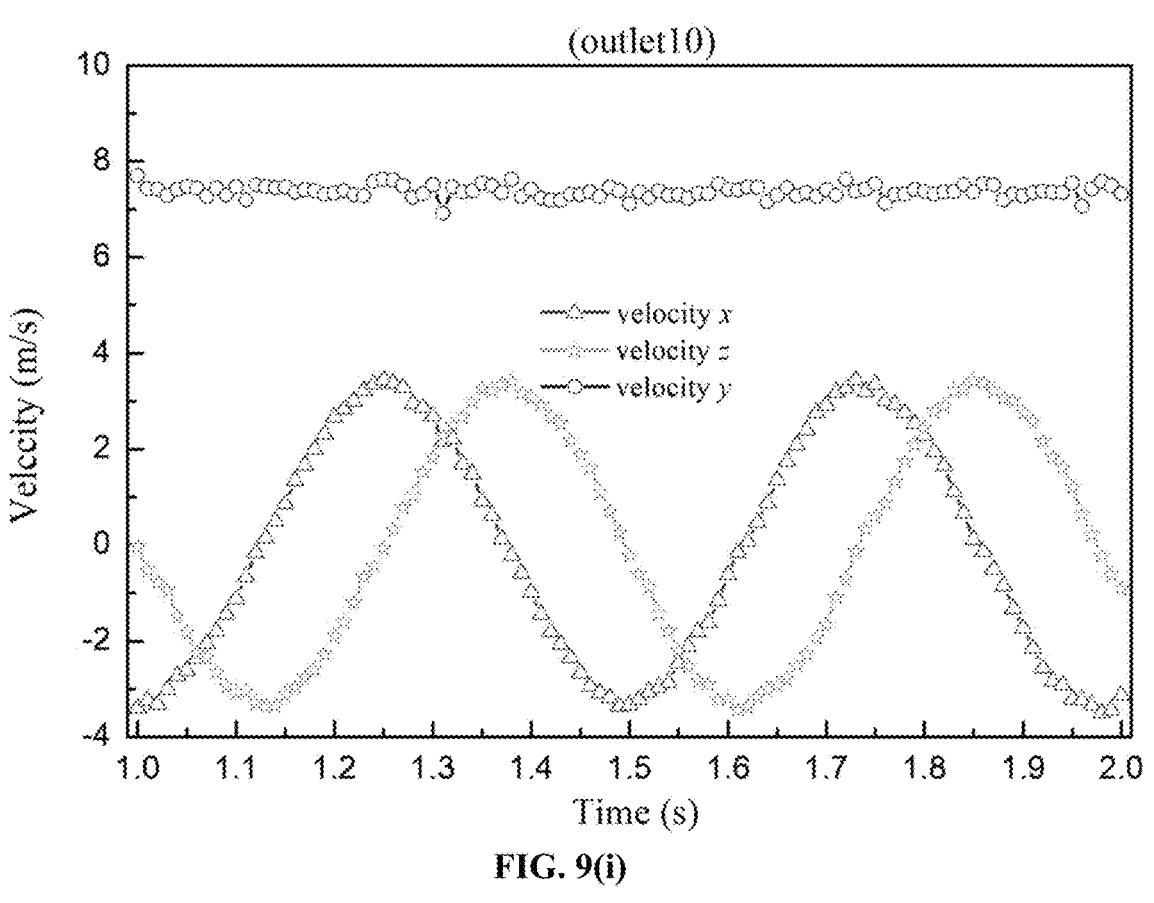
Figure 9J:
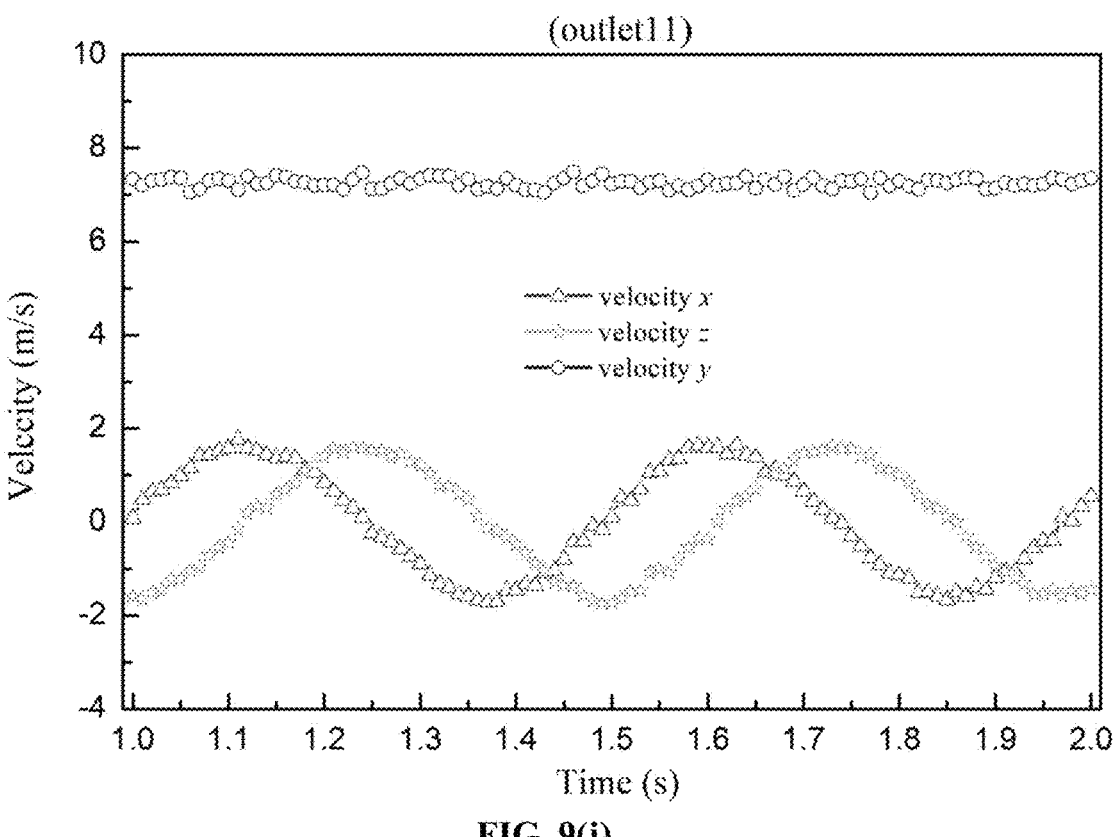
Figure 9K:
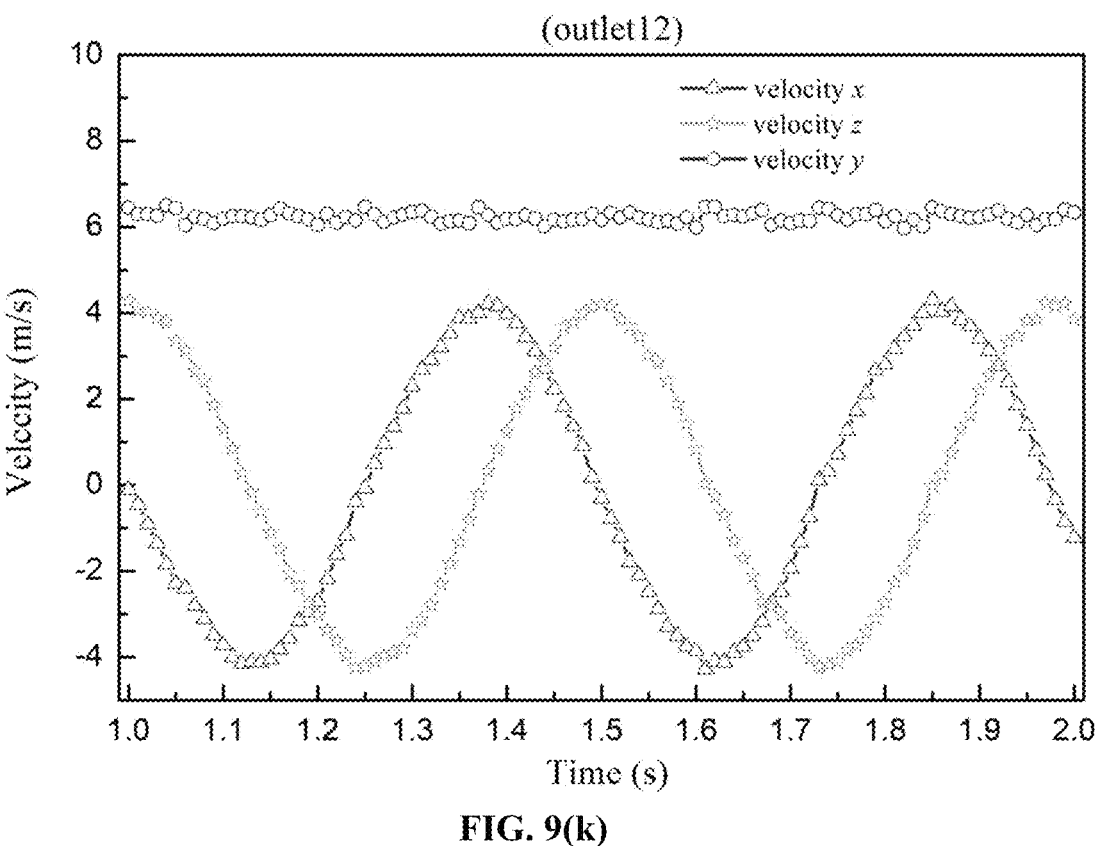
Figure 9L:
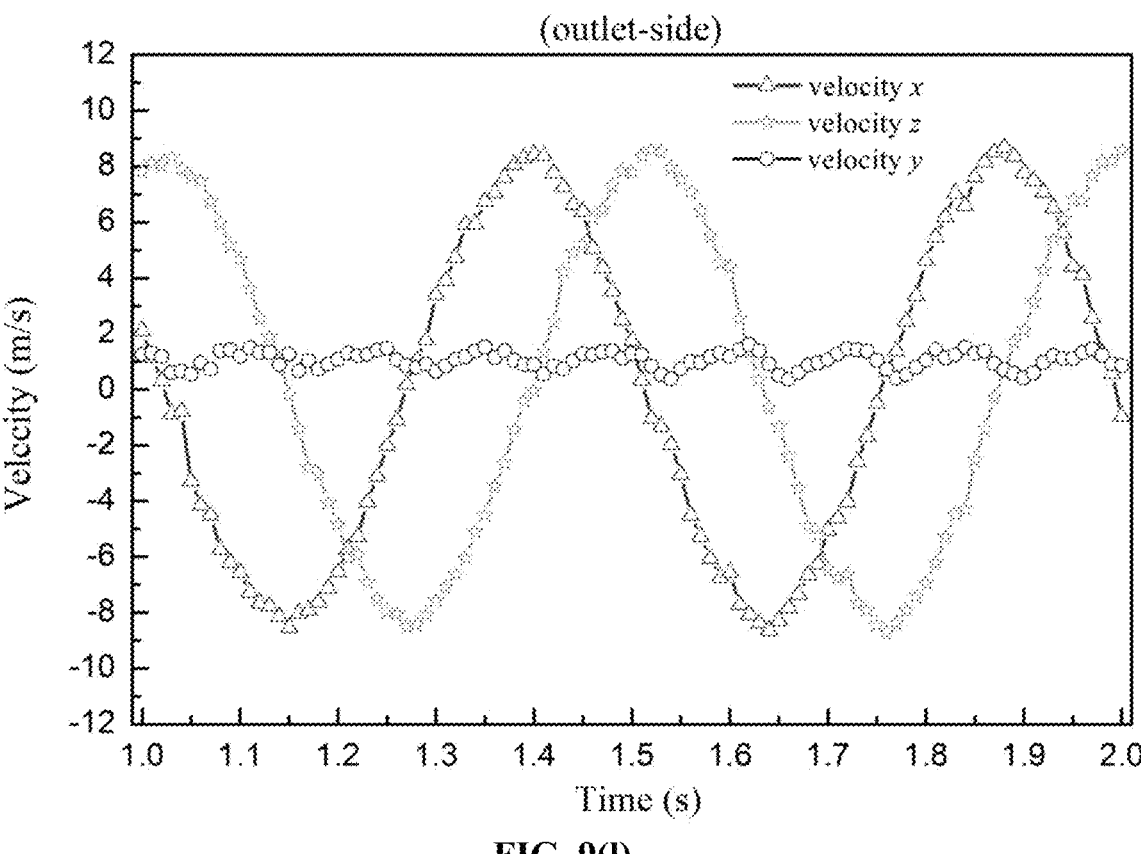
Figure 9M:
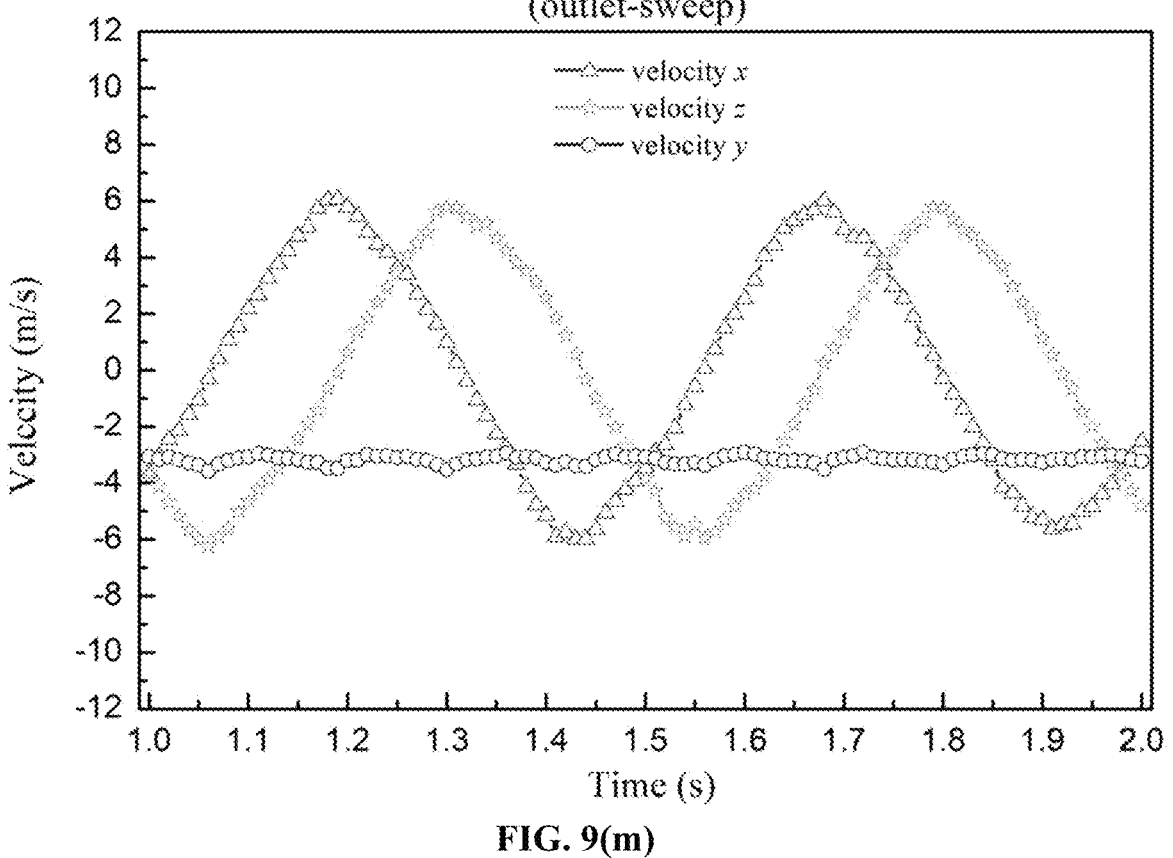

(12) Adhering to the meshing principle of the FAVOR technology, Cartesian meshing is executed on the overall model using FLOW-3D. As exemplified in FIG. 7, the distance between the top surface of the jet flow near-field computational domain and the nozzle is approximately 1-2 times the nozzle diameters. To circumvent the tracking of jet flow fields of the whole nozzles, the required outlet flow velocity of each nozzle and the passive rotation velocity of the volute are simultaneously monitored. A mesh resolution is set to be no more than ¹⁄₂₀ of the minimum nozzle diameter. Specific computation and time steps are determined, and the requisite hydraulic computation data is verified.

(13) A GMO coupling motion option in a Moving and Simple Deforming Objects model of a physics interface in FLOW-3D is enabled, and a baffle is inserted near the exit of the nozzle, specifically establishing a flow velocity monitoring surface at each outlet of the volute. The passive rotation of the volute is simulated using a TruVOF method, and the variation of the rotation velocity of the volute and the flow velocity at each nozzle exit over time are closely monitored, as depicted in FIG. 8 and FIGS. 9(a)-9(m).

(14) The construction of the dishwasher sink is accomplished using Creo software, with particular attention paid to creating the top surface of the sink body and embedding a volute model into the sink model.

Figure 10:
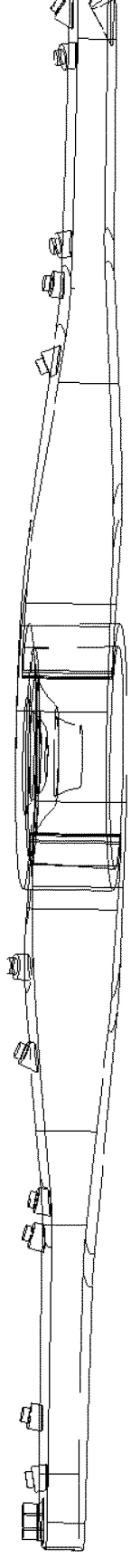
FIG. 10 shows the arrangement of the mass source on
volute.

(15) The work completed in (12) are replicated in the FLOW-3D simulation software. An overall jet inflow source is configured, ensuring that the shape of the mass source aligns with the nozzle exit. To address the complex issue of determining the direction of the mass source, the mass source is horizontally embedded above each nozzle, with the distance between the mass source and the exit of the nozzle set at 1.5 times the nozzle diameter, as illustrated in FIG. 10. Additionally, the outlet flow velocity of each nozzle obtained through monitoring in step (13) is inputted accordingly.

(16) The data obtained by monitoring in step (13) is integrated into the mass source, facilitating the simulation of nozzle jet flow under the passive rotation of the volute using the TruVOF method.

(17) Subsequently, the simulation results of the non-submerged rotating jet flow are subjected to post-processing, encompassing the evaluation of the variation pattern of the average water pressure on the top surface of the sink body over time. The computation of the water pressure adheres to the formulas detailed in Equation (12) and Equation (13).

$$\bar{P} = \int \bar{P}_t dt / \Delta t \qquad \text{(Equation 12)}$$

$$\bar{P}_t = \int P dA / \int dA \qquad \text{(Equation 13)}$$

where A is the area of a stress surface, $m^2$; t is time, s; $\bar{P}$ is an average pressure per unit of time, N; $\bar{P}_t$ is the average pressure of the plate at different moments, N.

Figure 11:
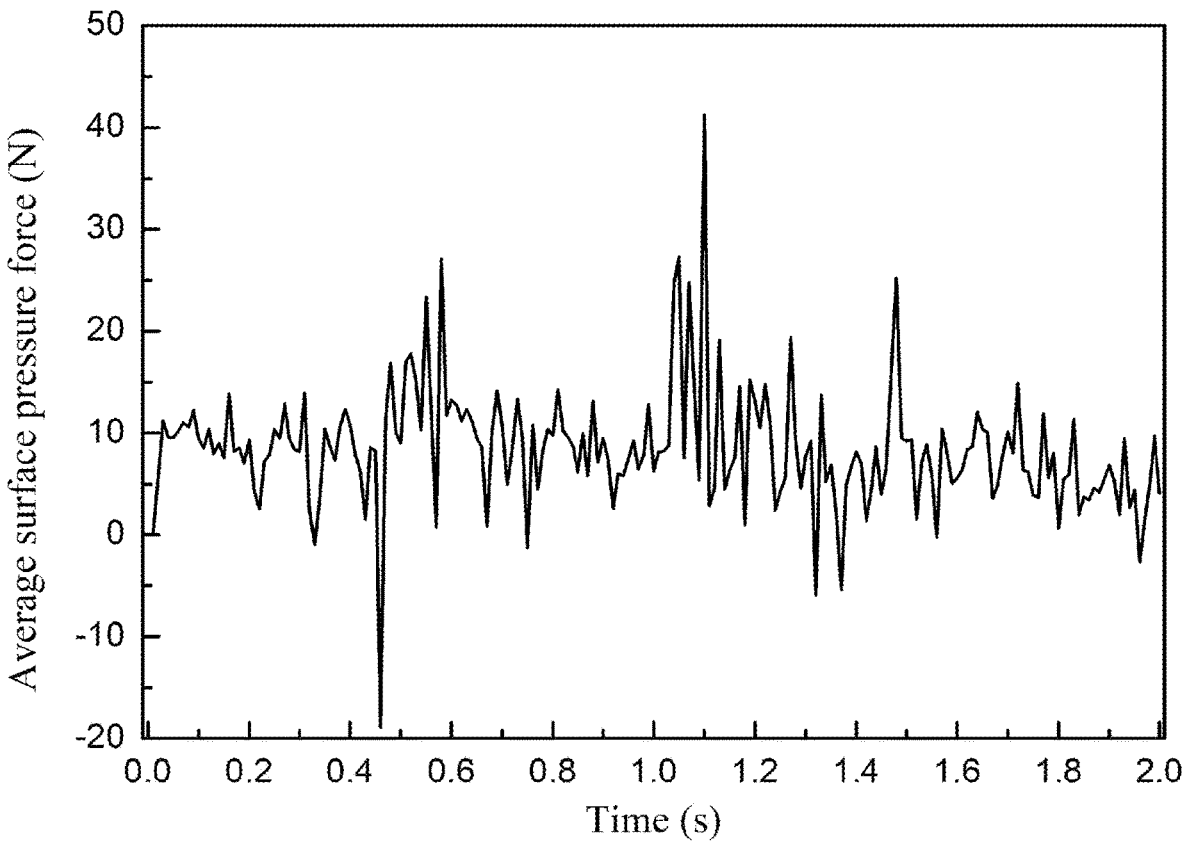
FIG. 11 shows the variation of mean pressure on the top
surface of the tank over time.

(18) The ultimate prediction outcome regarding the washing capacity of the dishwasher is depicted in FIG. 11. Moreover, the estimation of the maximum impact force and the average impact force is conducted by observing the fluctuation pattern of stress on a top plate over time.

What is claimed is:

1. An overall hydraulic performance prediction method for a sink-type dishwasher, comprising following steps:

step 1: constructing models of a composite impeller and a twin-volute spraying arm within a dishwasher based on the composite impeller and the twin-volute spraying arm within the dishwasher in a real operational condition, and conducting numerical simulations based on the models to obtain a pump characteristic curve for a new type of dishwasher pump under a static condition of a volute;

step 2: obtaining a full-open flow rate $Q_0$ from the pump characteristic curve, obtaining a rotation velocity adaptation coefficient $A_d$ and an axial velocity coefficient $B_d$, performing unsteady simulation on a passive rotation of the volute using a GMO-TruVOF method, and obtaining a passive rotation velocity of the volute and a flow rate at an exit of each nozzle; and step 3: taking the passive rotation velocity of the volute and the flow rate at the exit of each nozzle as initial conditions, conducting non-submerged rotational unsteady computation on nozzles based on FAVOR-TruVOF to obtain flow parameters of the dishwasher, and estimating a hydraulic washing capacity of the dishwasher according to the flow parameters.

2. The overall hydraulic performance prediction method for a sink-type dishwasher according to claim 1, wherein the constructing models of a composite impeller and a twin-volute spraying arm within a dishwasher based on the composite impeller and the twin-volute spraying arm within the dishwasher in a real operational condition, and conducting numerical simulations based on the models to obtain the pump characteristic curve for the new type of dishwasher pump under the static condition of the volute comprises following processes:

process 1.1: constructing a water body of the new type of dishwasher pump based on models of the composite impeller and a volute type spraying arm, meshing by using ICEM software, and performing unsteady simulation of the new type of dishwasher pump with Fluent software; and process 1.2: conducting numerical simulation predictions of the pump characteristic curve by using a RANS method, computing a head at a minimum of five different flow rates under the static condition of the volute, and plotting the pump characteristic curve.

3. The overall hydraulic performance prediction method for a sink-type dishwasher according to claim 2, wherein the obtaining the full-open flow rate $Q_0$ from the pump characteristic curve, obtaining the rotation velocity adaptation coefficient $A_d$ and the axial velocity coefficient $B_d$, performing unsteady simulation on the passive rotation of the volute using the GMO-TruVOF method, and obtaining the passive rotation velocity of the volute and the flow rate at the exit of each nozzle comprises following processes:

process 2.1: determining the full-open flow rate $Q_0$ using the pump characteristic curve obtained in process 1.2, acquiring the rotation velocity adaptation coefficient $A_d$, and the axial velocity coefficient $B_d$ suitable for the new type of dishwasher pump, constructing a virtual impeller model within the FLOW-3D software, and establishing a mapping relationship between parameters of a virtual impeller and the composite impeller;

process 2.2: constructing near-field computational domains at the exit of each nozzle, conducting Cartesian meshing on the virtual impeller, a volute spraying arm, and a near field of a nozzle jet flow domain based on FAVOR technology, and selecting an appropriate mesh resolution to ensure effective analysis of a computational domain; and process 2.3: enabling fluid-structure interaction and free surface computation of the new type of dishwasher pump based on the virtual impeller and the GMO-TruVOF method to realize a numerical simulation of the passive rotation of the volute, and monitoring the passive rotation velocity of the volute and the flow rate at the exit of each nozzle.

4. The overall hydraulic performance prediction method for a sink-type dishwasher according to claim 3, wherein the taking the passive rotation velocity of the volute and the flow rate at the exit of each nozzle as initial conditions, conducting non-submerged rotational unsteady computation on the nozzles based on the FAVOR-TruVOF to obtain flow parameters of the dishwasher, and estimating the hydraulic washing capacity of the dishwasher according to the flow parameters comprises following processes:

process 3.1: constructing a gas-liquid two-phase non-submerged jet flow computational domain with a free surface in a sink of the dishwasher, and setting a jet mass source in the gas-liquid two-phase non-submerged jet flow computational domain;

process 3.2: computing a complex non-submerged rotating jet flow field of a multi-nozzle combination based on the FAVOR-TruVOF by taking the flow rate at the exit of each nozzle and the passive rotation velocity of the volute obtained in process 2.3 as boundary conditions of the jet mass source; and process 3.3: post-processing non-submerged rotating jet flow computation results, which comprises analyzing distribution laws of jet flow impact pressure, vorticity, and other flow parameters, as well as evaluating the overall hydraulic performance of the dishwasher.

5. The overall hydraulic performance prediction method for a sink-type dishwasher according to claim 4, wherein in process 3.1, the setting of the jet mass source in the gas-liquid two-phase non-submerged jet flow computational domain comprises defining an inflow source in the computational domain, comprising a setting of position, direction, geometry, and flow velocity of the inflow source, and a distance between the jet mass source and the exit of each nozzle is 1.5 times the nozzle diameter, in particular, the flow rate is set as a function of time, and a data aligns with the flow rate of each nozzle obtained in process 2.3.

6. The overall hydraulic performance prediction method for a sink-type dishwasher according to claim 3, wherein in process 2.1, the constructing the virtual impeller model comprises: innovating the rotation velocity adaptation coefficient $A_d$ and the axial velocity coefficient $B_d$ for the new type of dishwasher pump, and constructing, in combination with the mapping relationship of parameters between the composite impeller and the virtual impeller, a virtual impeller assembly, namely, two cylinders stacked up and down, to respectively replace a forward curved axial flow cascade and a centrifugal radial blade of impeller, outer diameters and heights of the cylinders describing a region swept by the blade, a size of an inner diameter being set, a region fluid flowing out of the cylinders at a certain vortex and an axial velocity being defined, and rotation axes of the cylinders being determined using a two-point method.

7. The overall hydraulic performance prediction method for a sink-type dishwasher according to claim 3, wherein in process 2.2, the near-field computational domains at outlets of nozzles are obtained by selecting a non-submerged nozzle jet flow height, the non-submerged nozzle jet flow height is required to ensure that water flows out from nozzles without impacting monitoring of nozzle flow rate, and is also required to have no effect or negligible effect on a setting of a jet mass source in step 3, and a near-field height of a jet flow domain is 1-2 times a nozzle diameter of a highest point at a top of a nozzle opening.

8. The hydraulic performance prediction method for a sink-type dishwasher based on a multi-physics coupling simulation strategy according to claim 2, wherein in process 1.2, heads under the five flow rates exclude conditions of flows less than 0.2 $Q_d$, while a resultant five groups of data undergo linear approximation fitting.

9. The hydraulic performance prediction method for a sink-type dishwasher based on the multi-physics coupling simulation strategy according to claim 8, wherein the linear approximation fitting comprises fitting the pump characteristic curve to obtain the full-open flow rate $Q_0$, and determining the rotation velocity adaptation coefficient $A_d$ and the axial velocity coefficient $B_d$ suitable for the new type of dishwasher pump by using $Q_0$ and a parameter relationship between the composite impeller and the virtual impeller, a fitted linear expression being as follows:

$$h = aQ + Q_0$$

wherein h represents a head of a pump, with a unit of m;

a represents a slope of a straight line;

Q represents the flow rate, with a unit of l/min;

$Q_0$ represents both a horizontal axis intercept of a fitted straight line and a full-open flow rate of the pump;

a mapping relationship between parameters of the composite impeller and the virtual impeller is as follows:

$$H_{y1} = L \cos \beta_L$$

$$H_{y2} = H + b_2 - 0.3D$$

$$D_{y1} = D$$

$$D_{y2} = D_2$$

$$D_{y3} = d_h$$

wherein left side of above equations shows geometric parameters of the virtual impeller, and right side of above equations shows geometric parameters of the composite impeller;

$H_{y1}$ is a height of a virtual impeller I, with a unit of m;

$D_{y1}$ is an outer diameter of the virtual impeller I, with a unit of m;

$H_{y2}$ is a height of a virtual impeller II, with a unit of m;

$D_{y2}$ is an outer diameter of the virtual impeller II, with a unit of m;

$D_{y3}$ is a hub diameter of the virtual impeller, with a unit of m;

L is an airfoil chord length of the composite impeller, with a unit of m;

$\beta_L$ is an airfoil angle of the composite impeller, with a unit of degree°;

H is a height of a back cover plate of the composite impeller, with a unit of m;

$b_2$ is an outlet width of the composite impeller, with a unit of m;

D is a minimum outer diameter of the composite impeller, with a unit of m;

$D_2$ a maximum outer diameter of the composite impeller, with a unit of m;

$d_h$ is a hub diameter of the composite impeller, with a unit of m;

the rotation velocity adaptation coefficient $A_d$ and the axial velocity coefficient $B_d$ for the new type of dishwasher pump obtained according to the full-open flow rate $Q_0$ and the parameter relationship between the virtual impeller and the composite impeller being as follows:

$$A_d = \frac{\pi g n^2 D_2^2 (C_1 D^2 + C_2 D_2^2)}{4Q_0(L \cos \beta_L + H + b_2 - 0.3D)}$$

$$B_d = \frac{12Q_0}{\pi n (D_2^3 - D^3)}$$

wherein $C_1 = \varphi \pi^2 / 3600$ g($\varphi = 0.92 - 0.98$), and $C_2 = \psi \pi^2 / 3600$ g($\psi = 0.67 - 0.75$).

\* \* \* \* \*